United States Patent [19]

Olson

[11] 4,369,518
[45] Jan. 18, 1983

[54] COMPACT ANTENNA SYSTEM

[75] Inventor: John M. Olson, Port Hueneme, Calif.

[73] Assignee: Tanner Electronic Systems Technology, Inc., Van Nuys, Calif.

[21] Appl. No.: 211,314

[22] Filed: Nov. 28, 1980

[51] Int. Cl.³ .............................. H04H 1/00; H04B 1/18
[52] U.S. Cl. .................................... 455/3; 455/282; 455/286; 333/204
[58] Field of Search ................... 455/3, 281, 282, 286, 455/291; 333/204, 246; 343/702; 358/86, 114

[56] References Cited

U.S. PATENT DOCUMENTS

| | | | |
|---|---|---|---|
| 3,523,251 | 8/1970 | Halstead | 455/291 |
| 3,550,010 | 12/1970 | Byers | 455/286 |
| 3,566,315 | 2/1971 | Vinding | 333/204 |
| 4,135,170 | 1/1979 | Baril et al. | 333/246 |

Primary Examiner—Jin F. Ng

Attorney, Agent, or Firm—Herzig & Walsh, Inc.

[57] ABSTRACT

A compact antenna system for use in connection with pay television reception comprises a resonant cavity including a small dipole, the latter being connected to a circuit board containing circuitry for converting the received pay television signal to a frequency usable by the television receiver of the subscriber. The member defining the cavity is affixed to the circuit board, which in turn is mounted upon a holder attached to the exterior of the structure in which the television receiver is located. The circuit board includes a preamplifier-filter stage to filter extraneous signals and to promote preamplification of the signal from the antenna. The preamplified signal goes to the input of a mixer and from there is filtered to the frequency of the channel selected by the user of the television receiver. At least one triangular circuit element is utilized in the preamplifier and in the mixer.

8 Claims, 6 Drawing Figures

COMPACT ANTENNA SYSTEM

BACKGROUND OF THE INVENTION

1. Field of the Invention

The invention pertains to apparatus used in connection with receiving pay television signals.

2. Description of the Prior Art

In the rapidly expanding field of pay television, reception of the signal by a subscriber requires an external antenna together with means for converting the signal to a frequency which can be received by the television receiver of the subscriber. This is a process referred to as "down conversion" of the signal received by the external antenna.

In existing arrangement, a down converter is mounted exteriorly of a structure in which the television receiver of the subscriber is located and it is connected to an external antenna. This arrangement has proved unsatisfactory in certain respects. It requires separate installation of a large and sometimes unwieldy external antenna, and installation and connection thereto of a separate down converter element. Prior attempts at providing a compact combination of an antenna and down converter have proved unsatisfactory for a number of reasons. Primarily, the unfeasibility of such arrangements lies in the fact that a significant amount of antenna gain would be lost by replacing a large external antenna with a small, circuit board mounted antenna.

Thus, there has been a felt but unfulfilled need for a compact antenna system mountable externally of a structure housing a television receiver in connection with pay television which does not degrade the signal provided to the television receiver of the viewer and which is economically feasible.

SUMMARY OF THE INVENTION

A compact antenna system for use in connection with subscription television at the exterior of a structure containing a television receiver of a subscriber comprises a housing with an antenna means disposed therein to receive subscription television signals, the antenna means being connected to circuit board circuitry which processes the signals received by the antenna. A circuit board contains circuitry for processing signals from the output of the antenna and is attached to the housing and mounted upon a holder member, the latter being adaptable to be mounted outside a structure containing the television receiver for receiving subscription television signals. The circuitry disposed upon the circuit board includes preamplification and filter means for providing preamplification to, and to remove unwanted frequencies (such as radar and educational television) from signals received from the antenna member, the preamplification and filter means including amplifier means with bias and supply lines and at least one circuit element having a substantially triangular configuration. A first circuit element having a substantially triangular configuration is connected between the bias line and the bias terminal of the amplifier means and is tuned to resonate at the frequency to be amplified. A second triangular circuit element is connected between the supply line and the output of the amplifier means and is tuned to resonate at the frequency to be amplified.

The triangular circuit elements are coupled to quarter wave lines at their vertices.

DETAILED DESCRIPTION OF THE INVENTION

Figure 1:
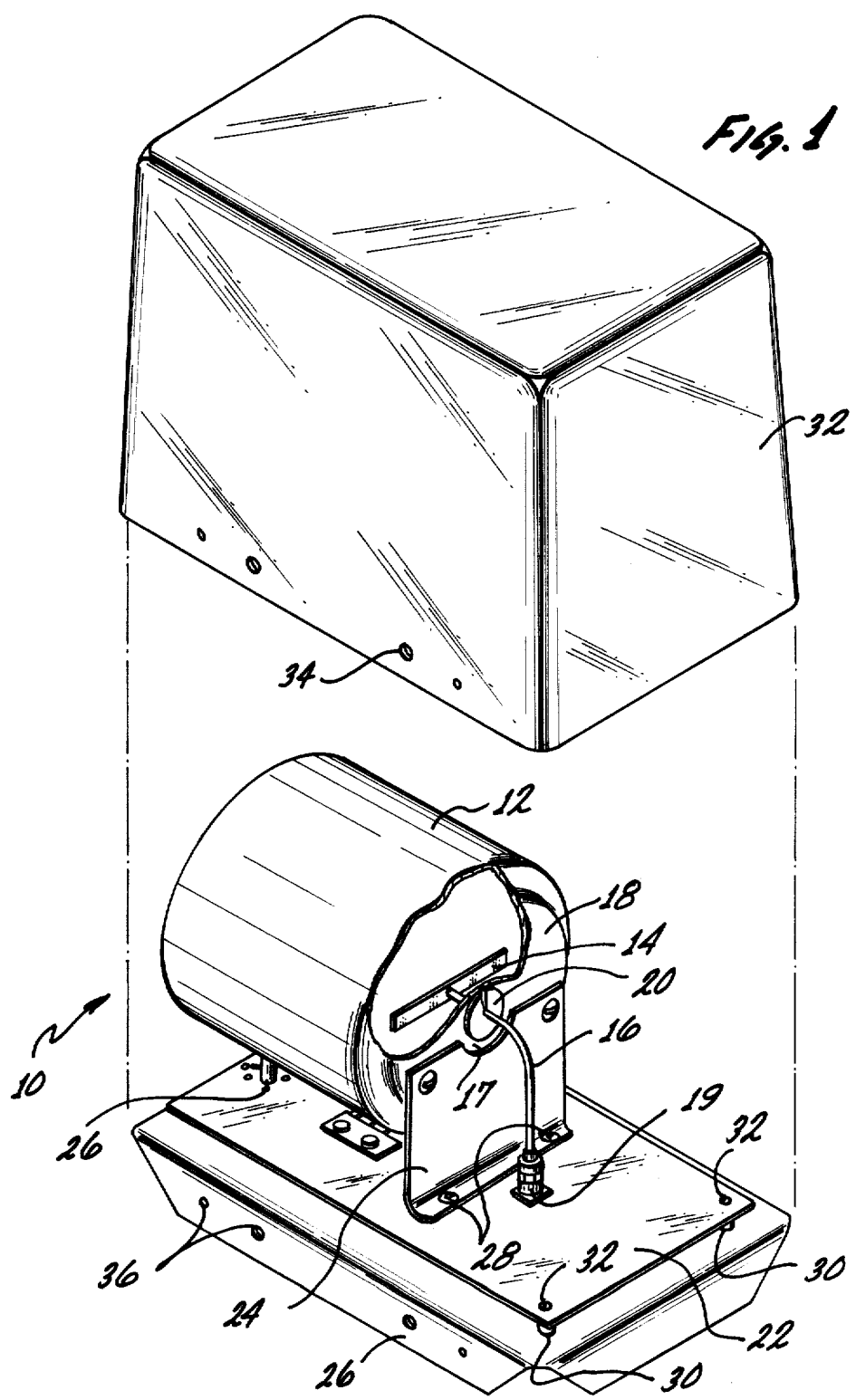
FIG. 1 depicts a perspective view, partially broken away, of a compact antenna system in accordance with the invention.

A compact antenna system 10 in accordance with the invention includes a cylindrical member defining a cavity containing a small dipole 14. The dipole 14 is mounted on a connector 16 which extends through an aperture 17 in the base 18 of the member 12. In particular application of the invention, the dipole 14 may be connected to the circuit board without use of a connector. A grommet 20 extending through aperture 17 holds the dipole at a selected orientation with respect to the housing.

The connector 16 connects dipole 14 to circuit board 22 (shown in simplified and schematic form only). The member 12 is mounted upon circuit board 22 by means of a plate 24 attached between the base 18 of the member 12 and the circuit board 22 and is further secured by a peg 26 which is disposed at a forward, open, end of member 12 opposite base 18. Connector 16 is connected to circuit board 22 by a connection 19 wherein leads from the dipole 14 are connected to leads of the circuitry on the circuit board 22.

Peg 26 is fastened at its lower end to a holder 28 and at its upper end is grooved (not shown) and receives a screw (not shown) which fastens the member 12 to it.

The circuit board 22 is fastened to and mounted upon holder 28, which in turn is mountable upon the exterior of a structure in which a television receiver of a subscriber is located. Mounting of the circuit board 22 on the holder 28 is by means of pegs 30 of the same type as peg 26. As in the case of peg 26, screws 32 connect the circuit board 22 to the pegs 30. Pegs 30 may be located at various points of the circuit board, preferably at each end and intermediately, to secure the connection between board 22 and holder 28. A cover 32 fits over the top of the antenna system 10 and can be securely closed by means of screw holes 34 alignable with corresponding holes 36 on the perimeter of the lateral sides of the holder 28. The cover 32 protects the antenna from the environment and is composed of a plastice material which will not attenuate the received signal.

Figure 2:
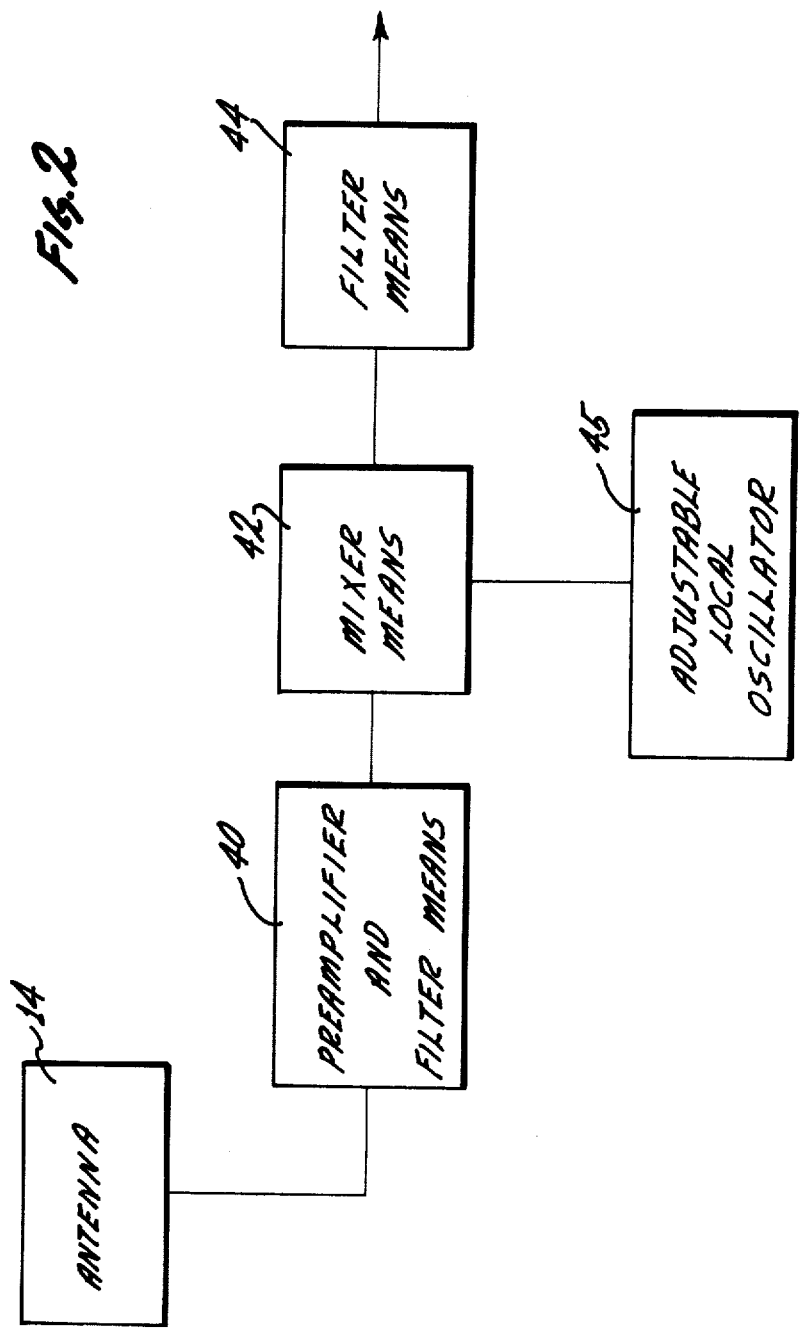
FIG. 2 is a schematic diagram of circuitry employed in connection with compact antenna systems in accordance with the invention.

As depicted in schematic form in FIG. 2, circuitry in accordance with the invention, which is disposed upon circuit board 22, comprises dipole 14, preamplifier and filter means 40 connected to the dipole 14, mixer means 42 connected to the preamplifier and filter means 40, and filter means 44 connected to the output of mixer means 42. From filter means 44, the output is connected to the television receiver in the home of the subscriber. A local oscillator 45 is connected to the mixer means 42.

Power sources, and connections thereto, for the respective components of the invention are of conventional type and are not shown.

Figure 3:
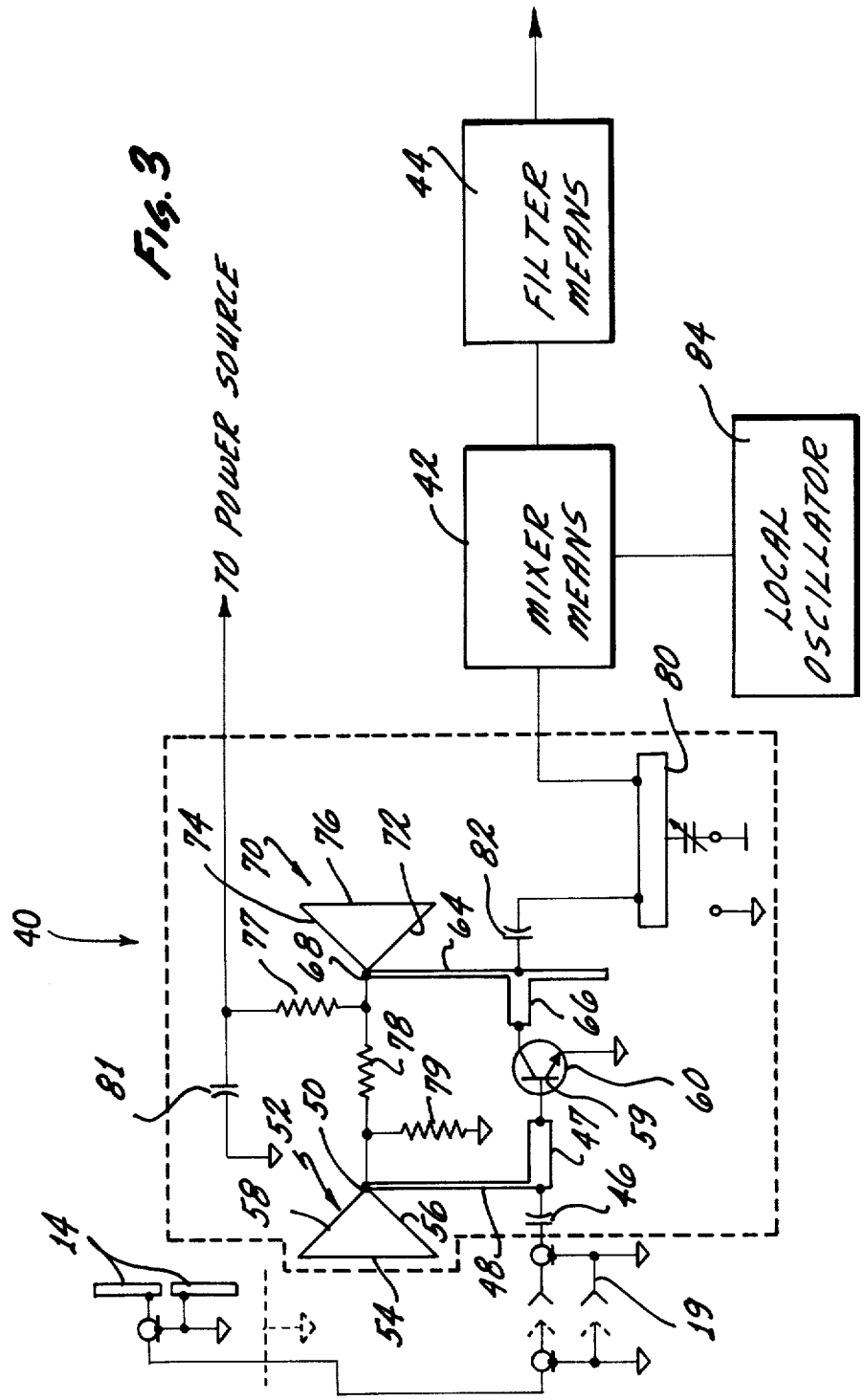
FIG. 3 is a schematic diagram, in somewhat more detail, of circuitry in accordance with the invention.

As depicted in FIG. 3, dipole 14 is grounded and connected by a lead in connector 16 to preamplifier and filter means 40 through connection 19.

Preamplifier and filter means 40 includes a capacitor 46 connected to the input from the dipole 14. The output of the capacitor 46 is connected to an input base matching network 47 and to a quarter wave line 48. Quarter wave line 48 is connected to a vertex 50 (which in the particular embodiment depicted is a right angle) of a triangular circuit element 52. Circuit element 52 is fully described in copending patent application No. 98,878 and filed on Nov. 30, 1979, now abandoned, which is hereby incorporated by reference herein and described in detail hereinbelow.

Base matching network 47 is connected to the bias input 59 of the amplifier 60 whose collector 62 is connected to a second quarter waveline 64 through a base matching output network 66. Quarter wave line 64 is connected to a right angle vertex 68 of a second triangular circuit element 70 of similar configuration to triangular circuit element 58. Circuit element 70 comprises legs 72, 74 intersecting at vertex 68 and forming substantially a right angle thereat and further includes a hypotenuse 76. Like triangle 58, triangular circuit element 70 comprises a solid triangular-shaped element deposited in standard fashion for stripline and microstripline technology upon the circuit board 22. Bias is provided to the bias terminal 59 of amplifier 60 by means of a D.C. bias network which is connected to a power source (not shown) and comprises resistors 77, 78, 79. Resistor 78 is connected to the bias lead and between the right angle vertices 52, 68 of the triangular circuit elements 58, 70, respectively. Resistor 77 is connected between the power line and the input of element 70; resistor 79 is grounded and is connected between resistor 78 and element 52. A grounded capacitor 81 in the power line provides power bypass.

Figure 4:
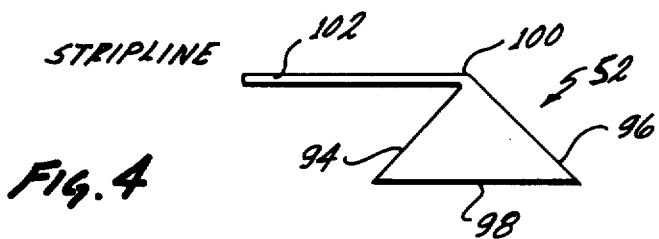
FIG. 4 comprises a perspective view of a circuit element employed in connection with the invention.

As depicted in FIG. 4, circuit element 52 comprises a triangular configuration. Circuit element 52 is depicted in a context of a stripline circuit board (not shown) and in a microwave application; however, such circuit elements may be used in other frequency ranges. Triangle 52 comprises legs 94, 96, and 98. Triangle 52 includes an angle substantially equal to 90° or a right angle, the leg 98 comprising the hypotenuse of the right triangle. Other angles may be utilized in particular applications, depending on band width and extent of bypass desired. Legs 94 and 96 are in this application essentially equal in length. The vertex 100 at the right angle is connected to a stripline input element 102. The triangular element 52 is fabricated in a conventional manner and of conventional materials for stripline and microstripline technology and is disposed upon a circuit board in conventional fashion.

Figure 5:
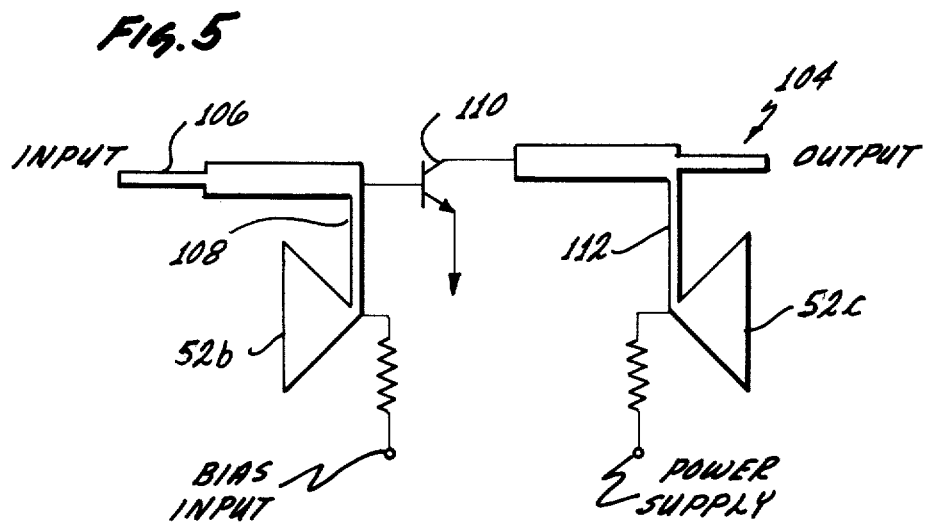
FIG. 5 is a view, somewhat schematic and simplified, of a circuit incorporating the circuit element depicted in FIG. 4.

Triangular element 52 provides the capability of a frequency selective, substantially broadband bypass characteristic and within a circuit provides a low impedence RF short circuit. For example, as depicted in FIG. 5, two triangular circuit elements 52b and 52c are connected in conjunction with an RF amplifier stage 104. An input base matching network 106 is connected to a ¼ wave line 108. The latter, in turn, is connected to the bias input of an amplifier 110 and to the right-angle vertex of triangle 52b which, in turn, is connected to the bias input of the amplifier stage 104. The collector of the amplifier 110 is connected to a second ¼ wave line 112 which is connected at its other end to the power supply of the amplifier stage and to the right-angle vertex of triangle 52c.

In this application, in which the triangles are installed on the open end of a ¼ wave isolation line, the triangle's function is to remove any RF signals present on the bias and power supply lines, thus facilitating and promoting amplifier stability and performance. Stability of the amplifier stage is improved as a result of the functioning of the ¼ wave lines in connection with the triangular circuit elements 52b, 52c.

Figure 6:
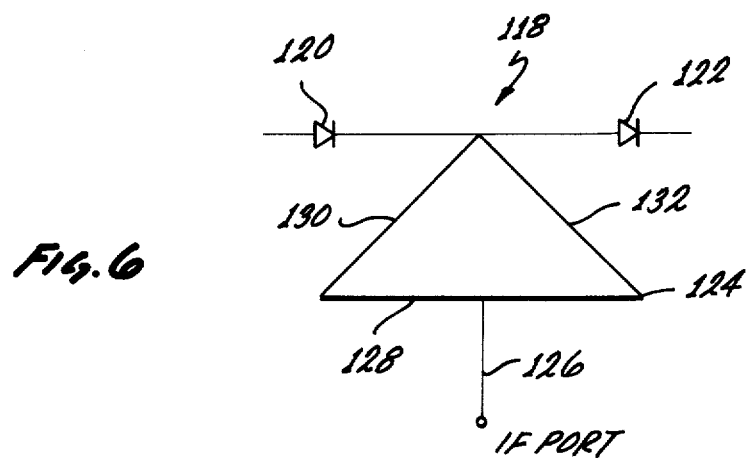
FIG. 6 is a somewhat schematic and simplified view of a portion of yet another circuit incorporating the circuit element depicted in FIG. 4.

As depicted in FIG. 6, a portion 118 of a diode mixer circuit includes a first diode 120 and a second diode 122 connected in series with one another. A triangular circuit element 124 is connected between diodes 120, 122. An RF port (not shown) is a source of RF signals or diodes 120, 122. An LO port (not shown) is a source of local oscillator injection at diodes 120, 122. An IF port 126 is connected to the hypotenuse 128 of triangle 124 whose legs 130, 132 form substantially a 90° angle at the vertex of the triangle 128 which is connected between diodes 120, 122. The particular form of mixer circuit depicted is for purposes of example only. Other mixer circuits, with or without diodes, may be employed with the herein described triangular circuit elements.

The triangle 124, when tuned to a resonant frequency band such that it includes the RF and the LO frequencies, acts as a bypass for those frequencies and permits only passage of the IF frequency through IF port 126. Use of the triangular circuit element thus obviates the necessity which existed under the prior art to utilize two ¼ wave lines. Between such ¼ wave lines, a high degree of frequency "pulling" would have existed, which compromises performance. Thus, use of the triangular circuit element enhances mixer performance.

Tuning of the herein described triangular circuit elements can be readily accomplished. Different shapes and sizes of triangles can be utilized for particular applications, as will be obvious to one skilled in the art to which this invention pertains. In a particular application of the invention in a mixer circuit such as that depicted in FIG. 6, the circuit element 52 comprises an isosceles right triangle with an altitude substantially equal to one-half inch in length, the altitude being the straight line from the right-angle vertex bisecting the right angle and perpendicular to the hypotenuse at its mid-point. In the application referred to, the thickness of circuit was substantially equal to 0.0285 inch, the board having an ER dielectric constant substantially equal to 4.05, the board being composed of FR-4 glass material. The thickness of the element 52 was substantially equal to 0.0014 inch. In the application referred to, the resonant frequency of the circuit element 52 was substantially equal to 2,170 megahertz.

A particular method of tuning a triangular circuit element is to vary the altitude of a circuit element having, for example, the isosceles right triangle configuration, until the desired frequency is achieved, in a manner obvious to one skilled in the art to which this invention pertains.

The preamplifier and filter means 40 filters out unwanted frequencies, such as radar and educational television channels, which constitute significant sources of interference with respect to pay television. The preamplifier and filter means further includes an adjustable filter 80 at the output of matching network 66 connected through a capacitor 82. The adjustable filter 80 is tuned to the desired frequency—in this case, 2154 mhz—and narrows the received band width which is relatively broadband at the input of the adjustable filter 80.

Mixer means 42 is connected to the output of adjustable filter 80 and is of standard type. The mixer is connected to local oscillator 45. In the mixer means 42, the signal from preamplifier 40 is mixed with the signal from local oscillator 84. Oscillator 84 is set at a frequency of 2209 mz, in the depicted example which pertains to tuning corresponding to channel 2 for standard television reception. At the output of mixer means 42, the signal is at two major frequencies: one frequency is the difference, and the other major frequency is the sum, of the carrier frequency and the local oscillator frequency. The difference is the desired frequency which, in the example depicted and discussed herein, is the channel 2 frequency of 55 mz. Also at the output of the mixer are certain harmonics intermediate between the carrier frequency and the sum and difference frequencies.

The output of mixer means 42 is connected to the input of filter means 44 which constitutes a band-pass filter at the IF output frequency. The filter means 44 filters out the sum frequency, thus providing as output a pure channel 2 signal, which is then received in the television receiver of the subscriber.

The circuit board 22 and its associated circuitry may be used in connection with a standard antenna, as opposed to the small dipole 14 depicted and described hereinabove. When so used, the circuit board 22 and the circuitry thereon provide heightened amplification and gain for the signal received by a standard antenna, thus improving reception and in particular permitting up to 20 miles' greater distance between the point of the transmission and the point of reception of the pay television signal.

A preferred embodiment of the invention has been described and depicted hereinabove. The invention shall be defined solely by the appended claims, interpreted in light of the specification and drawings.

What is claimed is:

1. A compact antenna system for use in connection with subscription television at the exterior of a structure containing a television receiver of a subscriber comprising:

a housing;

antenna means disposed within said housing to receive subscription television signals, said antenna means being connected to circuitry on a circuit board for processing said signals received by said antenna;

a circuit board member attached to said housing and mounted upon a holder member, said circuit board member containing circuitry connected to the output of said antenna member to process signals received thereby;

a holder member adaptable to be mounted outside a structure containing a television receiver to receive said subscription television signals;

circuitry disposed upon said circuit board member, said circuitry including preamplification and filter means for providing preamplification to, and to remove unwanted frequencies from, signals received from said antenna means, said preamplification and filter means including amplifier means having bias and supply lines and having a bias terminal, and at least one circuit element having a substantially triangular configuration, a first one of said at least one circuit element being connected between the bias line and the bias terminal of said amplifier means and being tuned to resonate at the frequency of said subscription television signals to be amplified, and a second of said circuit elements being connected between the supply line and the output of said amplifier means and being tuned to resonate at said frequency of said subscription television signal to be amplified.

2. The invention as set forth in claim 1 wherein said first triangular circuit element is coupled to a quarter wave line.

3. The invention as set forth in claim 2 wherein said at least one triangular circuit element is configured substantially as an isosceles right triangle and wherein said quarter wave line is connected to said triangle at the vertex of said triangle adjacent said right angle.

4. The invention as set forth in claim 2 wherein said quarter wave line is connected between the bias terminal of said amplifier means and said one triangular circuit element.

5. The invention as set forth in claim 4 wherein said amplifier means includes a collector terminal and wherein said second triangular circuit element is connected to a quarter wave line, the latter being connected to the collector terminal of said amplifier means.

6. The invention as set forth in claim 5 wherein said second triangular circuit element comprises substantially an isosceles right triangle and wherein said quarter wave line is connected thereto at the vertex thereof adjacent said right angle.

7. The invention as set forth in claim 1 wherein said circuitry further includes mixer means coupled to the output of said preamplifier and filter means and coupled to local oscillator means, said local oscillator means being adjustable to provide a frequency such that the difference of said frequency from said local oscillator means and the frequency of the signals received from said preamplifier and filter means constitutes the frequency of a television channel to which said television receiver is tuned.

8. The invention as set forth in claim 7 further including filter means connected to the output of said mixer means for substantially limiting the output bandwidth to that of the desired channel.

* * * * *